(12) United States Patent
Kim

(10) Patent No.: US 6,204,100 B1
(45) Date of Patent: Mar. 20, 2001

(54) CMOS DEVICE AND METHOD FOR FABRICATING THE SAME

(75) Inventor: Sang Yeon Kim, Taegu-kwangyoksi (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/249,314

(22) Filed: Feb. 12, 1999

(30) Foreign Application Priority Data

Feb. 12, 1998 (KR) .................................................. 98-4190

(51) Int. Cl.[7] .................................................. H01L 21/00
(52) U.S. Cl. ........................ 438/154; 438/163; 438/164; 257/351
(58) Field of Search .................................. 438/154, 156, 438/164, 163; 257/351

(56) References Cited

U.S. PATENT DOCUMENTS

| | | | |
|---|---|---|---|
| 4,649,626 | * | 3/1987 | Leong . |
| 4,755,481 | * | 7/1988 | Faraone . |
| 4,816,893 | * | 3/1989 | Mayer et al. . |
| 5,024,965 | * | 6/1991 | Chang et al. . |
| 5,116,771 | * | 5/1992 | Karalkar . |
| 5,591,650 | | 1/1997 | Hsu et al. . |
| 6,096,585 | * | 8/2000 | Fukuda et al. . |

* cited by examiner

Primary Examiner—Long Pham

(57) ABSTRACT

A CMOS device and a method for fabricating the same, is disclosed, the device including an insulating film formed on a substrate, first and second sapphire patterns formed on the insulating film at fixed intervals, first and second epitaxial semiconductor layers formed on the first and second sapphire patterns, isolating structures formed at edges of the first and second semiconductor layers, respectively, first and second trenches formed down to predetermined depths from surfaces of the first and second semiconductor layers, sidewall spacer structures formed at both sides of the first and second trenches, a gate insulating film formed on a surface of each of the first and second semiconductor layers between the sidewall spacer structures, first and second gate electrodes formed in the first and second trenches respectively on the gate insulating film, first conductivity type impurity regions formed in the first semiconductor layer on both sides of the first gate electrodes, and second conductivity type impurity regions formed in the second semiconductor layer on both sides of the second gate electrodes. The CMOS device exhibits reduced latch-up and hot carrier characteristics, improved device reliability, reduced junction and parasitic capacitances, and improved device performance.

12 Claims, 15 Drawing Sheets

CMOS DEVICE AND METHOD FOR FABRICATING THE SAME

BACKGROUND OF THE INVENTION

1. Field of the Invention

The present invention is related to a semiconductor device, and more particularly, to a CMOS(Complementary Metal Oxide Semiconductor) device and a method for fabricating the same which has improved operation speed and reliability.

2. Discussion of the Related Art

There have been ceaseless efforts in fabrication of a semiconductor integrated circuit for reducing a size of an MOSFET(Metal Oxide Semiconductor Field Effect Transistor) which can provide a highly integrated high performance semiconductor chip. The size has been scaled down to a sub-micron level. The size reduction of the semiconductor device should be both in horizontal and vertical directions for balancing with various device characteristics. That is, in the device size reduction, for example, if a distance between a source and a drain comes closer in a transistor, undesirable changes in the characteristics of device occur, e.g., the short channel effect. In order to improve the short channel effects in a high density device, an LDD(Lightly Doped Drain) structure is employed, in which low concentration junctions are formed under sidewalls of a gate.

FIG. 1 illustrates an equivalent circuit for a background art CMOS invertor.

In general, as shown in FIG. 1, the background art CMOS invertor is provided with an NMOS transistor Q1 and a PMOS transistor Q2. The NMOS transistor Q1 and PMOS transistor Q2 are connected in series, with their gates receiving an input signal Vin in common. A drain of the NMOS transistor Q1 is connected to a ground terminal Vss, a source of the PMOS transistor Q2 is adapted to be supplied with a static voltage Vdd, and connection terminals of the NMOS transistor Q1 and the PMOS transistor Q2 are provided as an output terminal Vout.

A background art CMOS device and a method for fabricating the same will be explained with reference to the attached drawings. FIG. 2 illustrates a section of the background art CMOS device.

Referring to FIG. 2, the background art CMOS transistor is provided with an n-well 12 and a p-well 13 formed in surfaces of the semiconductor substrate 11, field oxide films 14 formed in isolating region and field regions of the n-well 12 and the p-well 13, first and second gate electrodes 16a and 16b formed on the gate insulating film 15 in active regions of the n-well 12 and the p-well 13 isolated by the field oxide film 14, insulating film sidewalls 22 at both sides of the first and second gate electrodes 16a and 16b respectively, and heavily doped p type impurity regions 24 and heavily doped n type impurity regions 26, both with LDD structures, in surfaces of the semiconductor substrate 11 on both sides of the first and second gate electrodes 16a and 16b respectively.

FIGS. 3A to 3I illustrate sections showing the steps of a background art method for fabricating a CMCS device.

Referring to FIG. 3A, n type impurity ions and p type impurity ions are selective injected into predetermined regions of a semiconductor substrate 11 and subjected to drive in diffusion, to form an n-well 12 and a p-well 13 in surfaces of the semiconductor substrate 11. Then, an initial oxide film and a nitride film are formed in succession on an entire surface of the semiconductor substrate 11, subjected to photolithography and etching to remove the nitride film selectively to define field regions and active regions, and an LOCOS(local oxidation of silicon) is conducted to form field oxide films 14 on an interface region of the n-well 12 and the p-well 13 and field regions.

As shown in FIG. 3B, a gate insulating film 15 and a gate electrode polysilicon layer 16 are formed on an entire surface of the semiconductor substrate 11 inclusive of the field oxide films 14. Then, a first photoresist film 17 is formed on the polysilicon layer 16 and subjected to exposure and development for patterning the first photoresist film 17. As shown in FIG. 3C, the polysilicon layer 16 and the gate insulating film 15 are selectively removed using the patterned photoresist film 17 as a mask, to form first and second gate electrodes 16a and 16b in active regions on the n-well 12 and the p-well 13.

As shown in FIG. 3D, the first photoresist film 17 is removed, and a second photoresist film 18 is coated on an entire surface of the semiconductor substrate 11 inclusive of the first, and second gate electrodes 16a and 16b and subjected to patterning by exposure and development, to leave the second photoresist film 1 only over the p-well 13 region. Then, p type impurities are lightly injected into an entire surface of the semiconductor substrate 11 using the patterned second photoresist film 18 as a mask, to form first LDD(Lightly Doped Drain) regions 19 in surfaces of the semiconductor substrate 11 on both sides of the first gate electrode 16a.

As shown in FIG. 3E, the second photoresist film 18 is removed, and a third photoresist film 20 is coated on an entire surface of the semiconductor substrate 11 inclusive of the first, and second gate electrodes 16a and 16b and subjected to patterning by exposure and development, to leave the third photoresist film 20 only over the n-well region 12. Then, n type impurities are injected into an entire surface of the semiconductor substrate 11 using the patterned third photoresist film 20 as a mask, to form second LDD regions 21 in surfaces of the semiconductor substrate 11 on both sides of the second gate electrode 16b.

As shown in FIG. 3F, the third photoresist film 20 is removed, and an insulating film is formed on an entire surface or the semiconductor substrate 11 inclusive of the first, and second gate electrodes 16a and 16b and is etched back, to form insulating film sidewalls 22 at both sides of the first, and second gate electrodes 16a and 16b.

As shown in FIG. 3G, a fourth photoresist film 23 is coated on an entire surface of the semiconductor substrate 11 inclusive of the first and second gate electrodes 16a and 16b and subjected to patterning by exposure and development to leave the fourth photoresist film 23 only over the n-well region. Then, source/drain p type impurities are heavily injected into an entire surface of the semiconductor substrate using the patterned fourth photoresist film 23 as a mask, to form heavily doped p type impurity regions 24 connected to the first LDD regions 19 in surfaces of the semiconductor substrate 11 on both sides of the first gate electrode 16a. The first gate electrode 16a and the heavily doped p type impurity regions 24 form a PMOS device.

As shown in FIG. 3H, the fourth photoresist film 23 is removed, and a fifth photoresist film 25 is coated on an entire surface of the semiconductor substrate 11 inclusive of the first and second gate electrodes 16a and 16b and subjected to patterning by exposure and development, to leave the fifth photoresist film 25 only over the p-well region 21. Then, source/drain n type impurities are heavily injected into an entire surface of the semiconductor substrate 11 using the patterned fifth photoresist film 25 as a mask, to form heavily doped n type impurity regions 26 connected to the second LDD regions 21 in surfaces of the semiconductor substrate 11 on both sides of the second gate electrode 16b. The second gate electrode 16b and the heavily doped impurity regions 26 on both sides thereof form an NMOS device.

As shown in FIG. 3I, by removing the fifth photoresist film 25, fabrication of a CMOS device formed with an NMOS device and a PMOS device or. an n-well 12 and a p-well 13 in a semiconductor substrate 11 respectively is completed.

However, the background art CMOS device and a method for fabricating the CMOS device have the following problems.

First, the hot carrier effect caused by Junction capacitances between the source/drain regions increases as device size is scaled down to a sub-micron level, which degrades performance and reliability of the device.

Second, latch-up occurs between the NMOS and the PMOS transistors and this degrades device performance.

Third, the uneven surface coming from the formation of the NMOS and the PMOS transistors causes difficulty in formation of wiring.

SUMMARY OF THE INVENTION

Accordingly, the present invention is directed to a CMOS device and a method for fabricating the same that substantially obviates one or more of the problems due to limitations and disadvantages of the related art.

An object of the present invention is to provide a CMOS device and a method for fabricating the same, in which junction capacitances and parasitic capacitances are eliminated for improving device operation speed and planarizing of wiring.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the CMOS device includes an insulating film formed on a substrate, first and second sapphire patterns formed on the insulating film at fixed intervals, first and second semiconductor layers formed on the first and second sapphire patterns, isolating films formed between the first and second sapphire patterns and the first and second semiconductor layers, respectively, first and second trenches formed down to predetermined depths from surfaces of the first and second semiconductor layers, sidewall spacers formed at both sides of the first an second trenches, a gate insulating film formed on a surface of each of the first and second semiconductor layers between the sidewall spacers, first and second gate electrodes formed in the first and second trenches respectively on the gate insulating film, first conductivity type impurity regions formed in the first semiconductor layer on both sides of the first gate electrodes, and second conductivity type impurity regions formed in the second semiconductor layer on both sides of the second gate electrodes.

In other aspect of the present invention, there is provided a method for fabricating a CMOS device, including the steps of (1) forming an insulating film on a substrate, (2) forming first, and second sapphire patterns on the insulating film at fixed intervals, (3) forming first and second semiconductor layers on the first and second sapphire patterns, respectively, (4) forming isolating films between the first and second sapphire patterns and the first and second semiconductor layers and at Opposite sides, (5) forming first, and second trenches in surfaces of the first, and second semiconductor layers to predetermined depths, respectively, (6) forming sidewall spacers at both sides of the first and second trenches, respectively, (7) forming a gate insulating film on a surface of each of the first and second semiconductor layers in the first and second trenches, (8) forming first, and second gate electrodes on the gate insulating film, (9) forming a second conductivity type impurity regions in the first semiconductor layer on both sides of the first gate electrode, and (10) forming a first conductivity type impurity regions in the second semiconductor layer on both sides of the second gate electrode.

It is to be understood that both the foregoing general description and the following detailed description are exemplar, and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIGS. 3A to 3I illustrate sections showing the steps of a background art method for fabricating a CMOS device;

DETAILED DESCRIPTION OF THE PREFERRED EMBODIMENT

Figure 1:
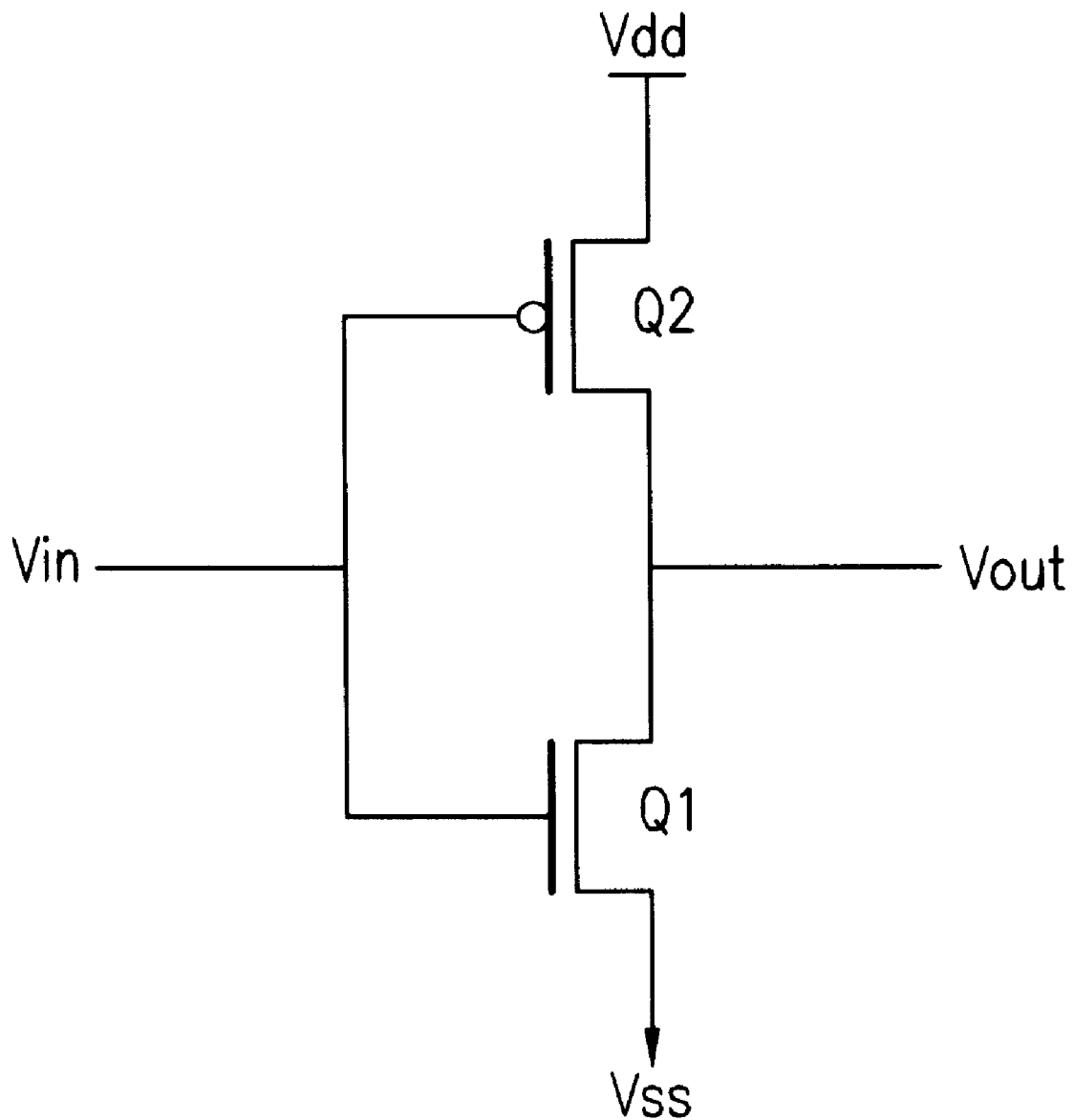
FIG. 1. illustrates an equivalent circuit for a background art MOS invertor.
Figure 2:
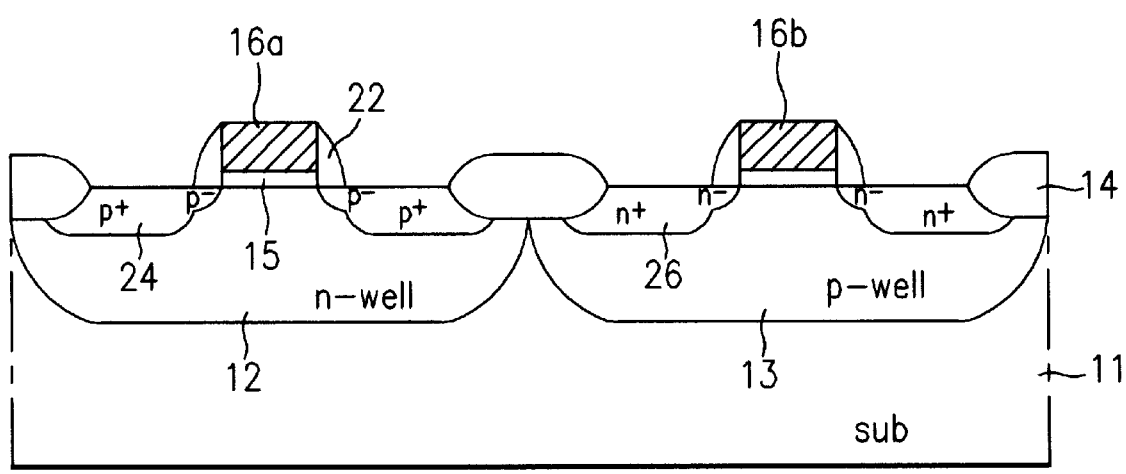
FIG. 2. illustrates a section of a background art CMOS device.
Figure 3A:
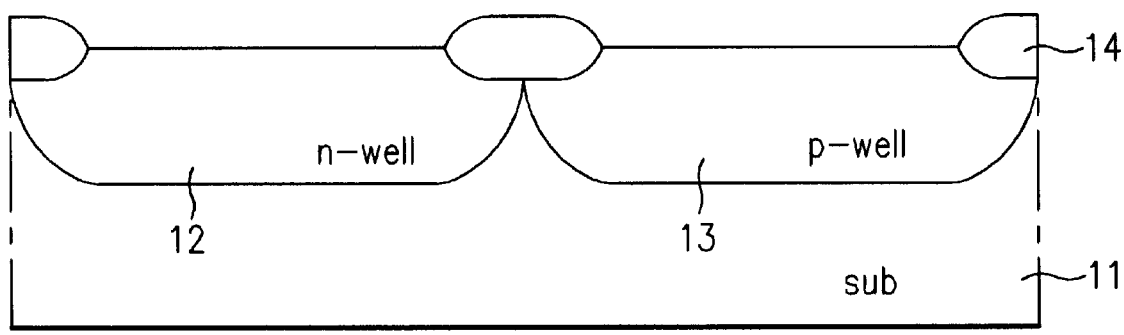
Figure 3B:
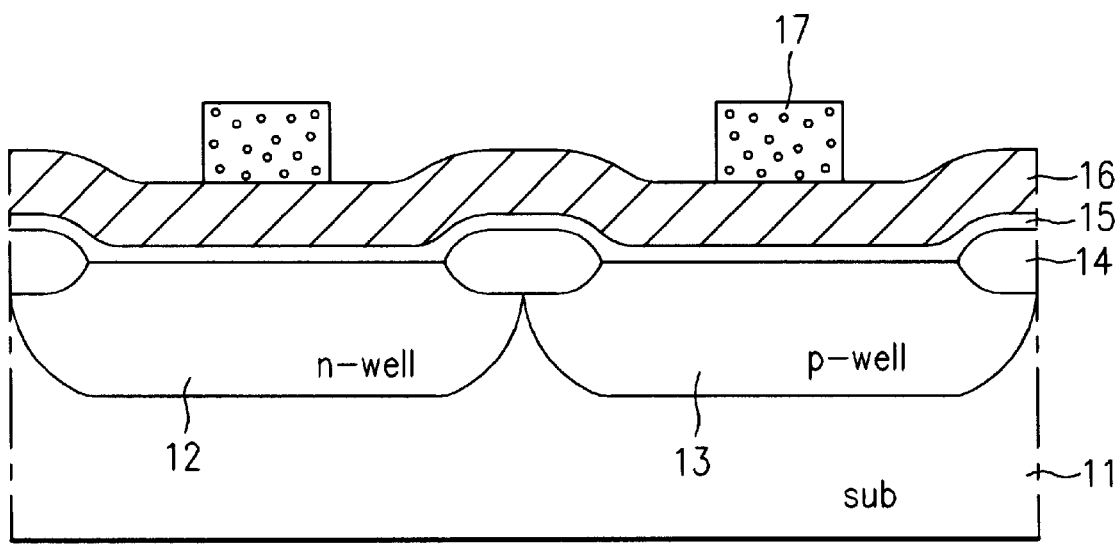
Figure 3C:
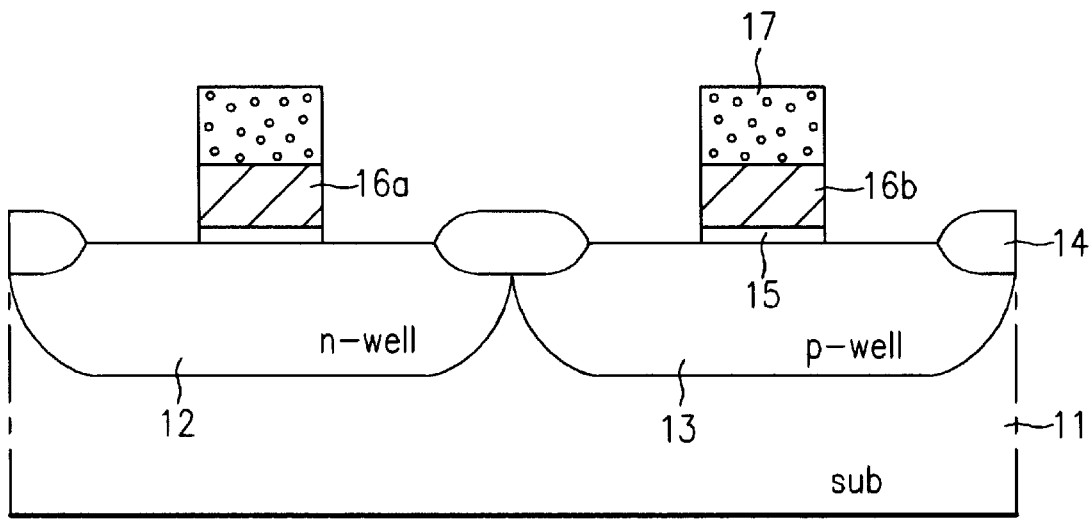
Figure 3D:
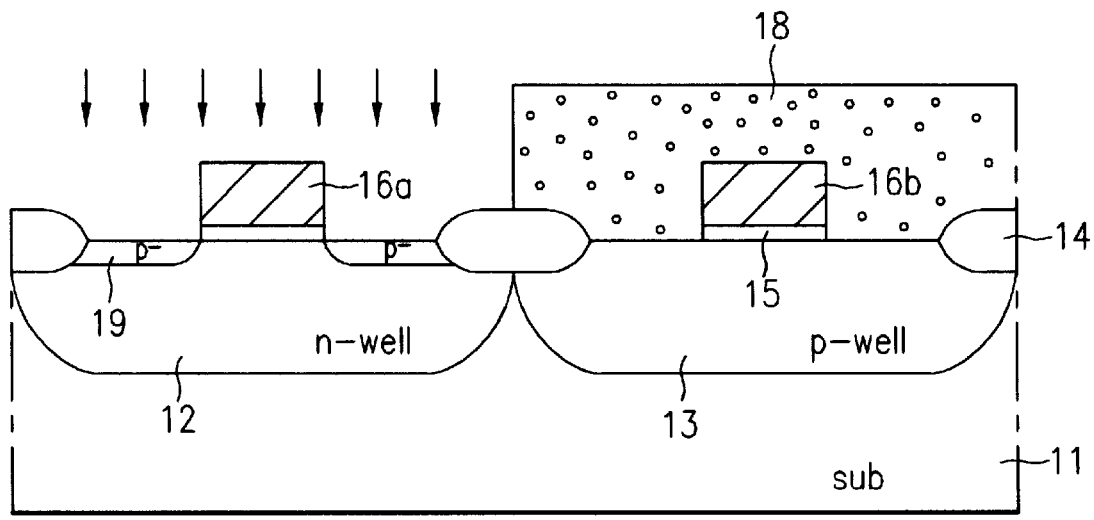
Figure 3E:
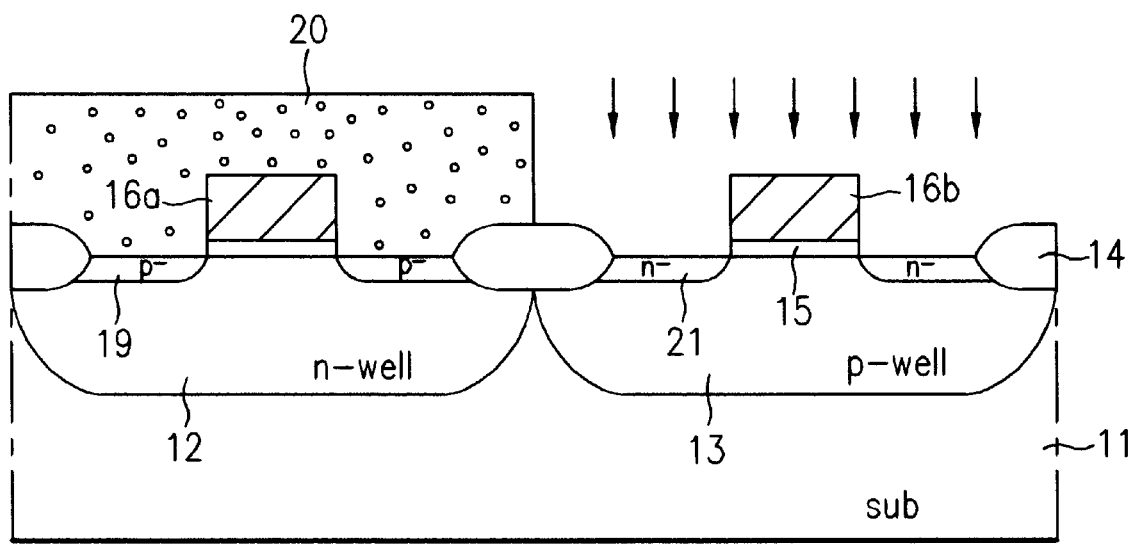
Figure 3F:
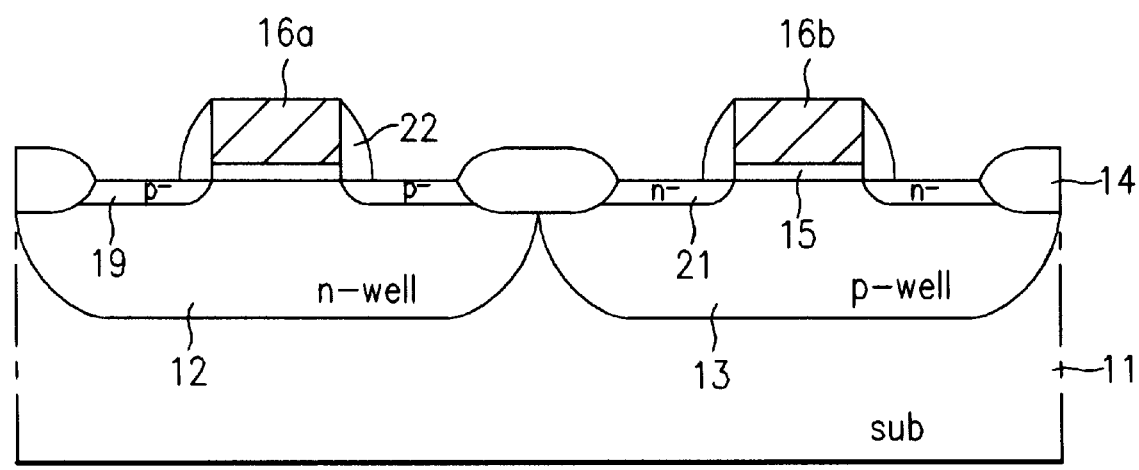
Figure 3G:
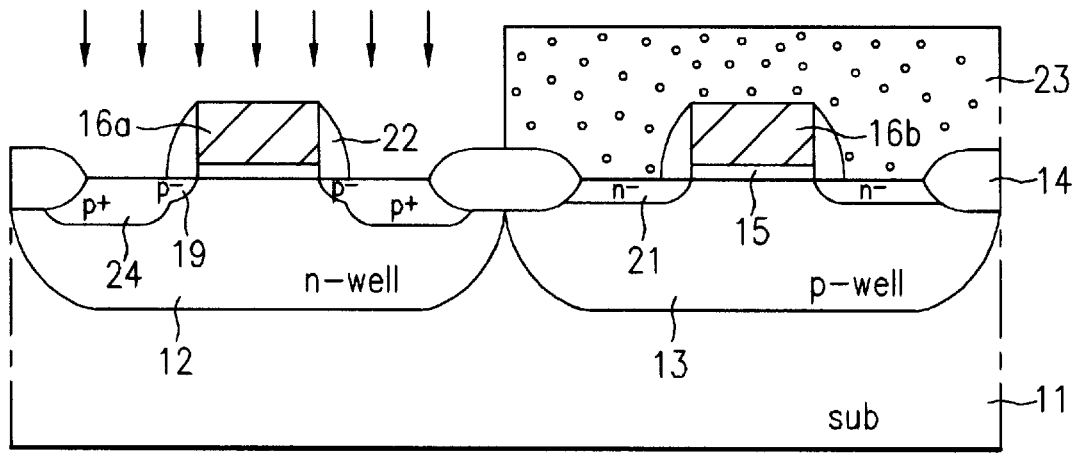
Figure 3H:
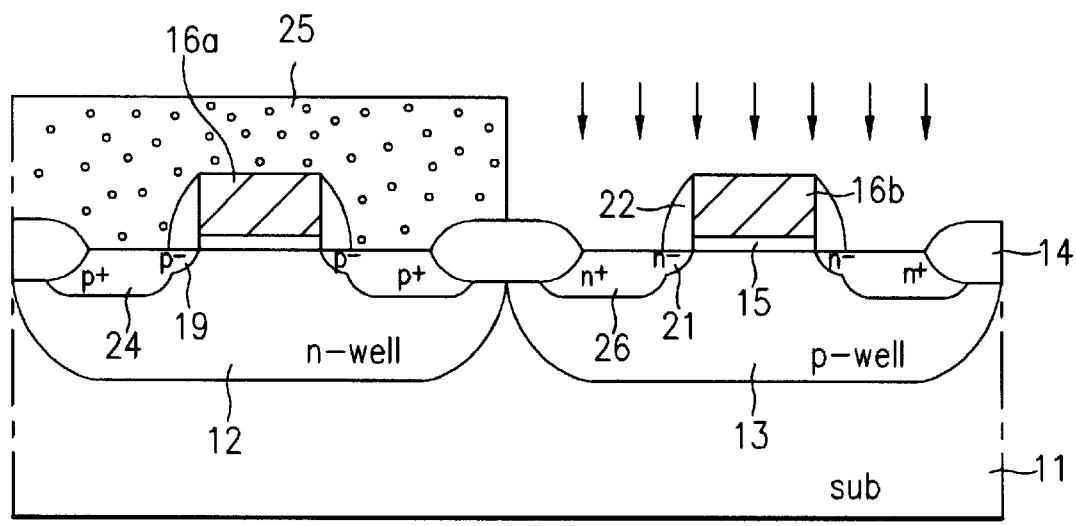
Figure 31:
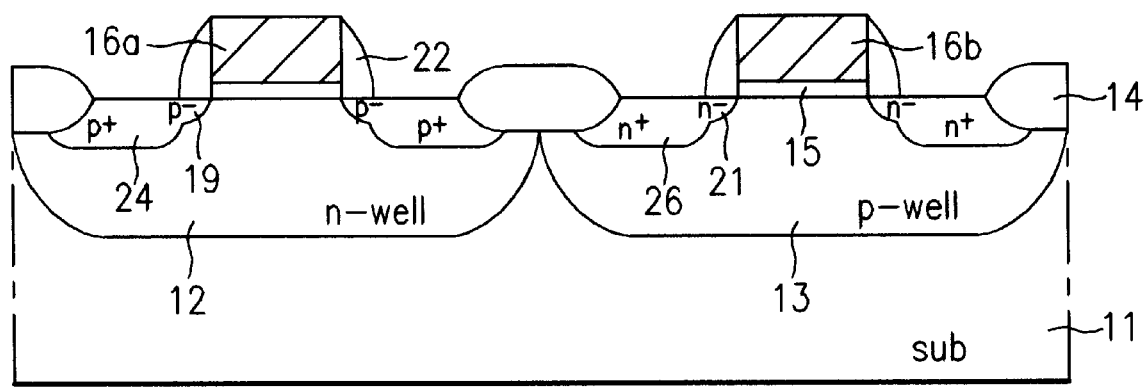
Figure 4:
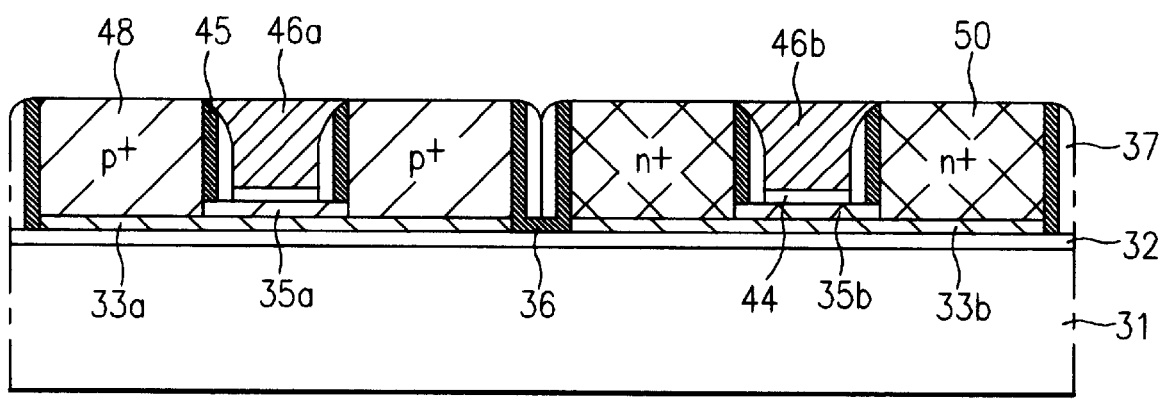
FIG. 4 illustrates a section of a CMOS device in accordance with a preferred embodiment of the present invention; and, FIGS. 5A to 5O illustrates sections showing the steps of a method for fabricating a CMOS device in accordance with a preferred embodiment of the present invention.

Reference will now be made in detail to the preferred embodiments of the present invention, examples of which are illustrated in the accompanying drawings. FIG. 4 illustrates a section of a CMOS device in accordance with a preferred embodiment of the present invention.

Referring to FIG. 4, the CMOS device in accordance with a preferred embodiment of the present invention includes a buried oxide film 32 formed on a semiconductor (e.g., silicon) substrate 31, first and second sapphire patterns 33a and 33b formed on the buried oxide film 32 at fixed intervals, first and second epitaxial semiconductor (e.g., silicon) layers 35a and 35b formed on the first and second sapphire patterns 33a and 33b respectively having first and second trenches respectively to form gate electrodes therein, sidewall spacers 45 formed at both sides of the first and second trenches, a gate insulating film 44 formed on a surface of each of the first and second epitaxial layers 35a and 35b, first and second gate electrodes 46a and 46b formed in the first and second trenches respectively on each of the gate insulating films 44, heavily doped p type impurity regions 48 and heavily doped p type impurity regions 50 formed in the first and second epitaxial layers 35a and 35b on both sides of the first and second gate electrodes 46a and 46b respectively, and a first intrinsic semiconductor (e.g., undoped polysilicon) layer 36 and a first insulating layer (e.g., a High temperature Low pressure Deposition (HLD) oxide film) 37 formed between the first and second epitaxial layers 35a and 35b and the first and second sapphire patterns 33a and 33b for device isolation. The sidewall spacer structure 45 is formed of a second intrinsic semiconductor (e.g., undoped polysilicon) layer (see FIG. 5J) 42 and a second insulating layer (e.g., an HLD oxide film) 43 (see FIG. 5J), and the first epitaxial semiconductor layer 35a is lightly doped with p type impurity ions and the second epitaxial semiconductor layer 36b is lightly doped with n type impurity ions.

Figure 5A:
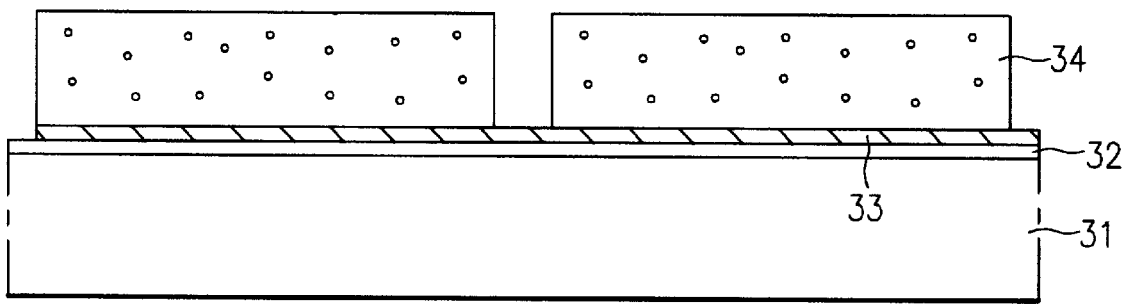
Figure 5B:
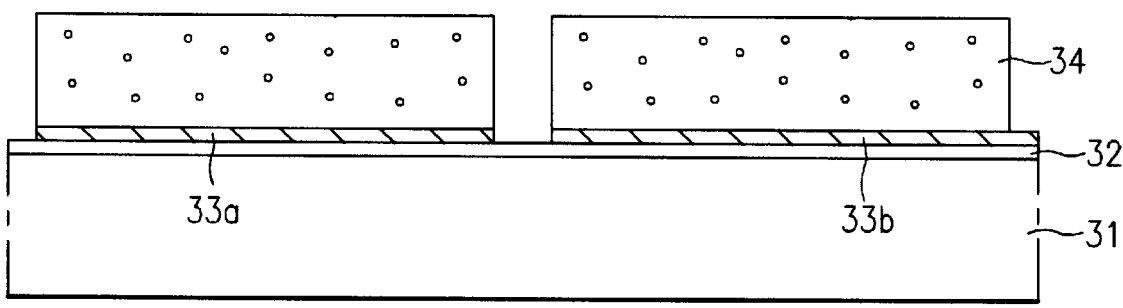
Figure 5C:
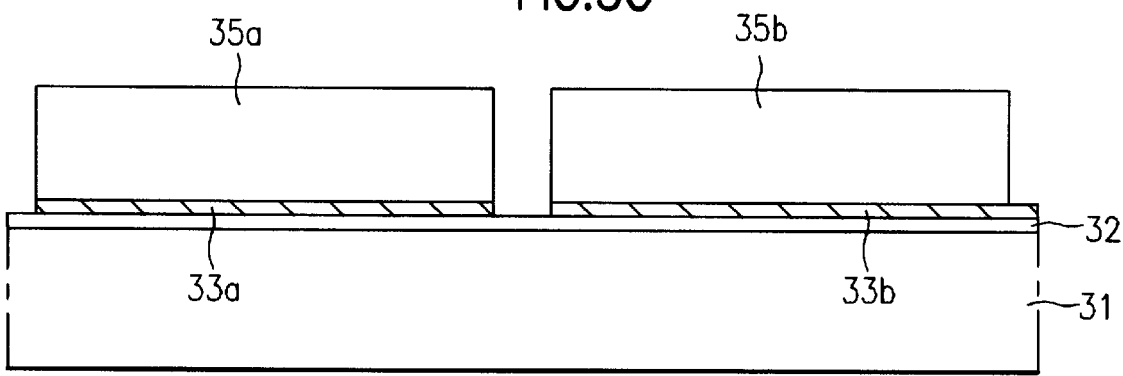
Figure 5D:
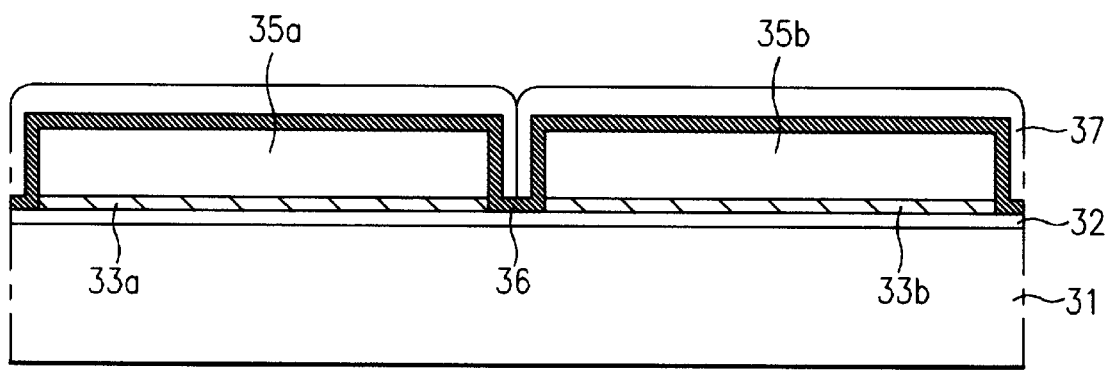
Figure 5E:
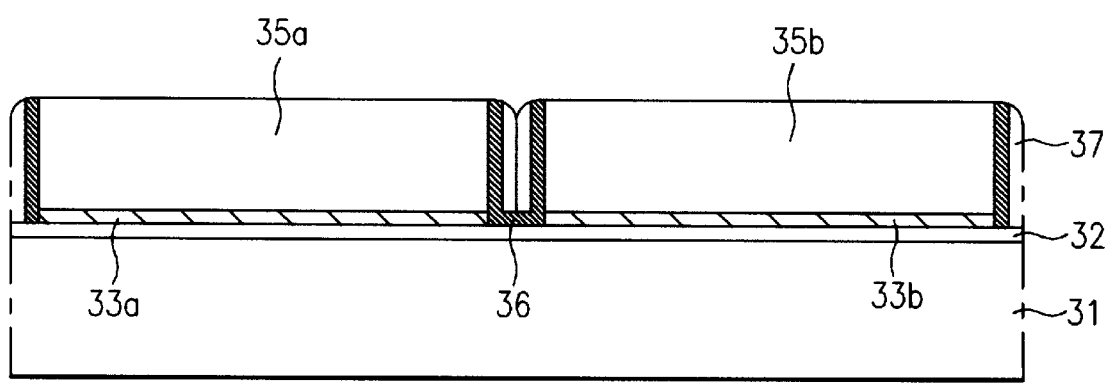
Figure 5F:
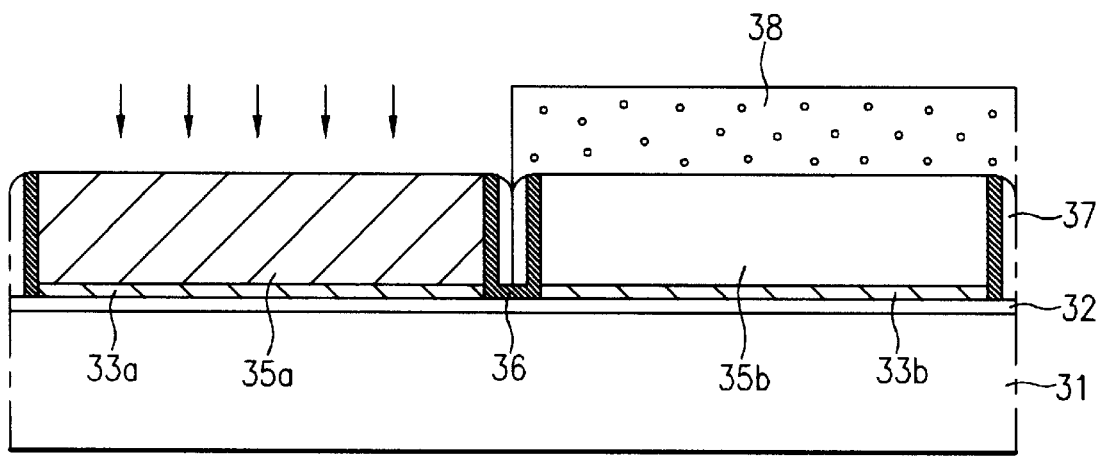
Figure 5G:
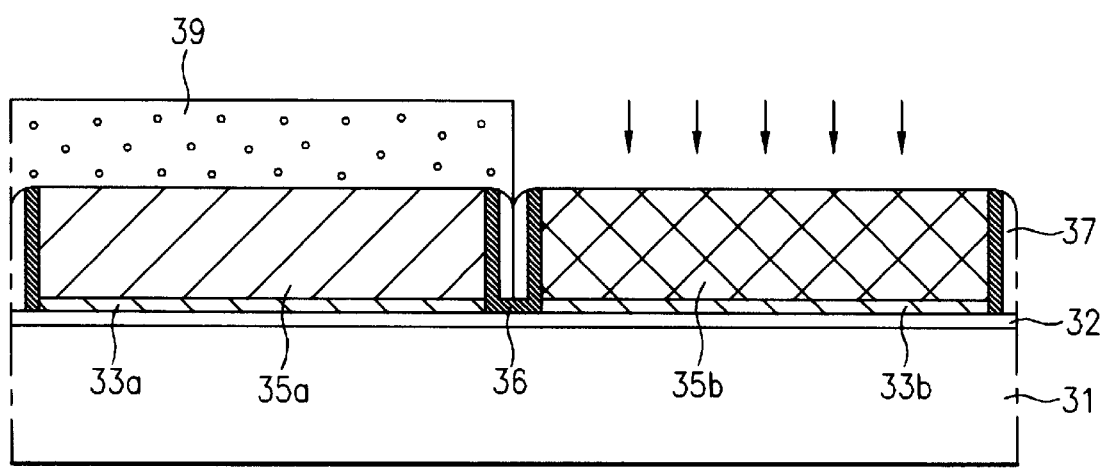
Figure 5H:
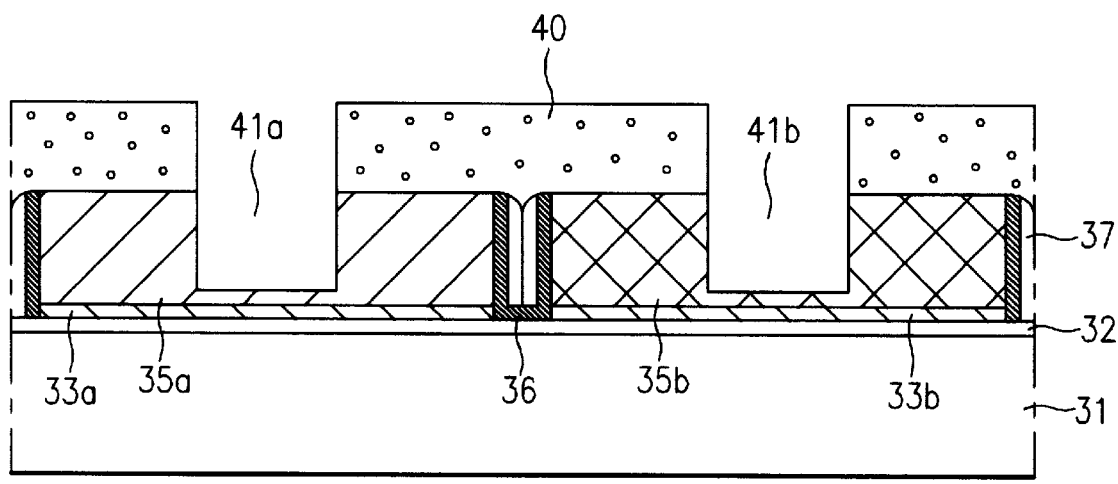
Figure 5I:
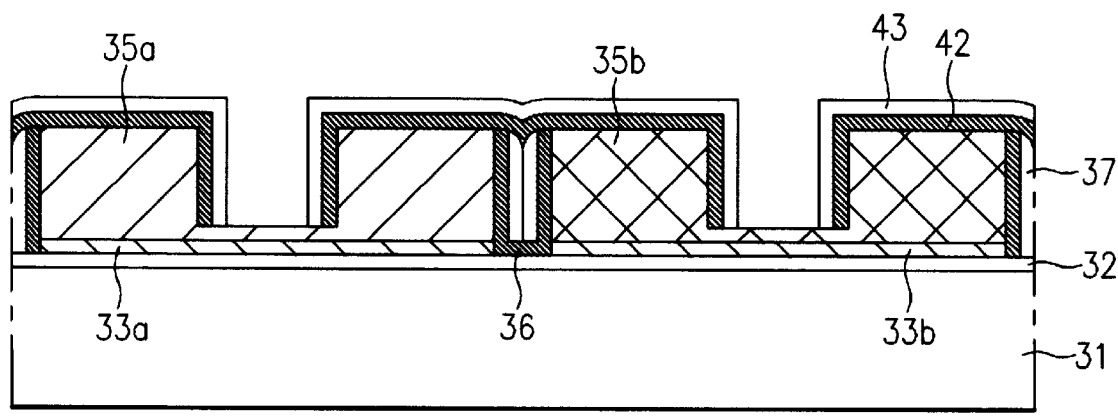
Figure 5J:
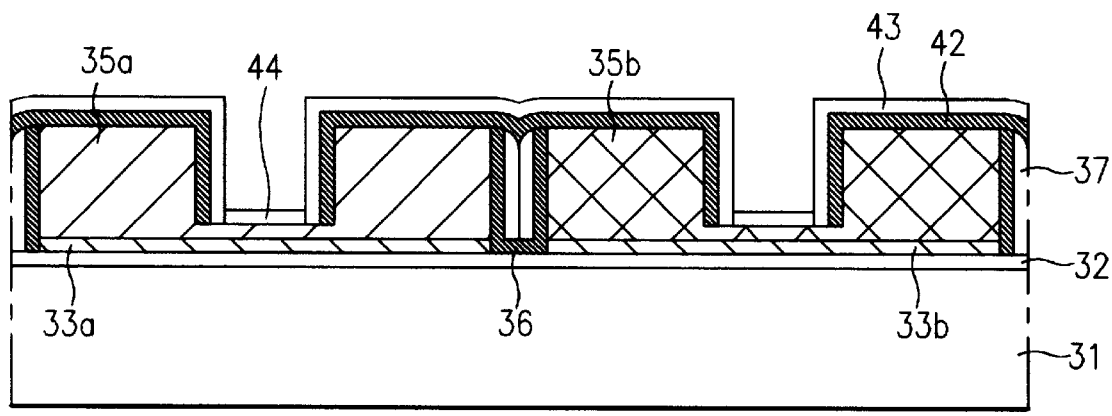
Figure 5K:
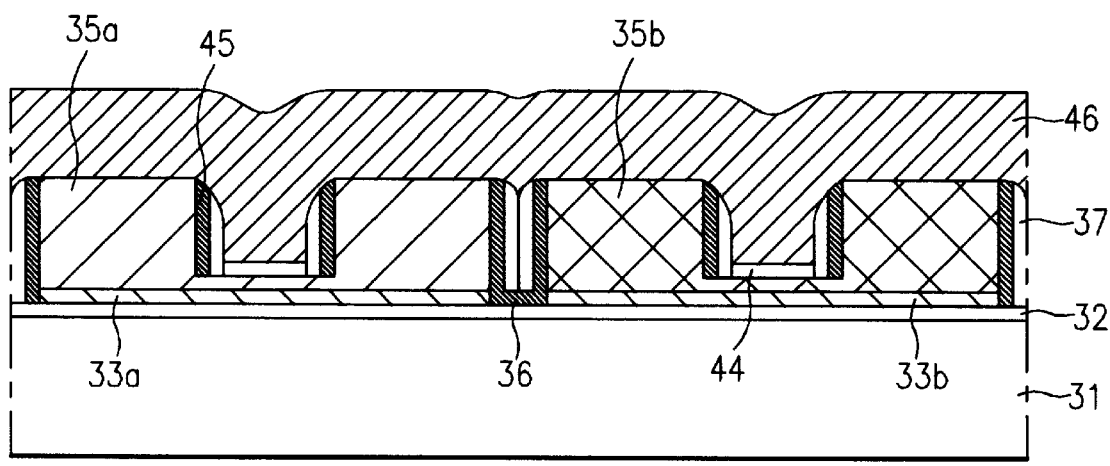
Figure 5L:
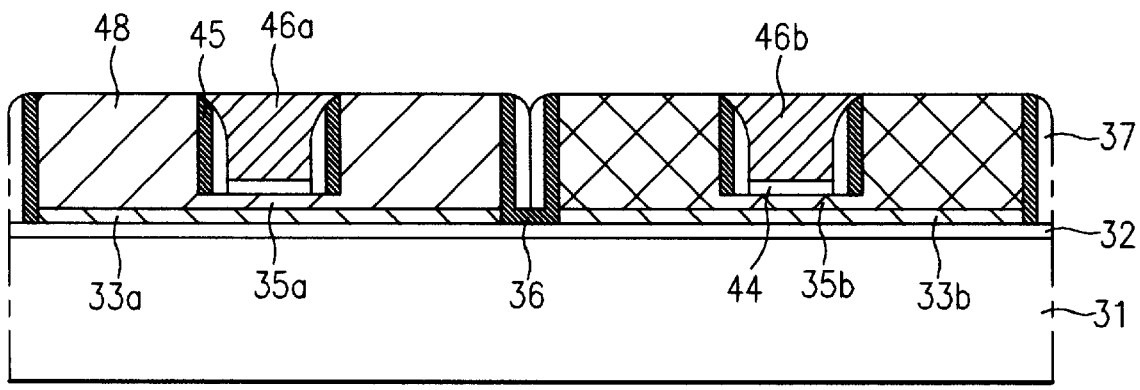
Figure 5M:
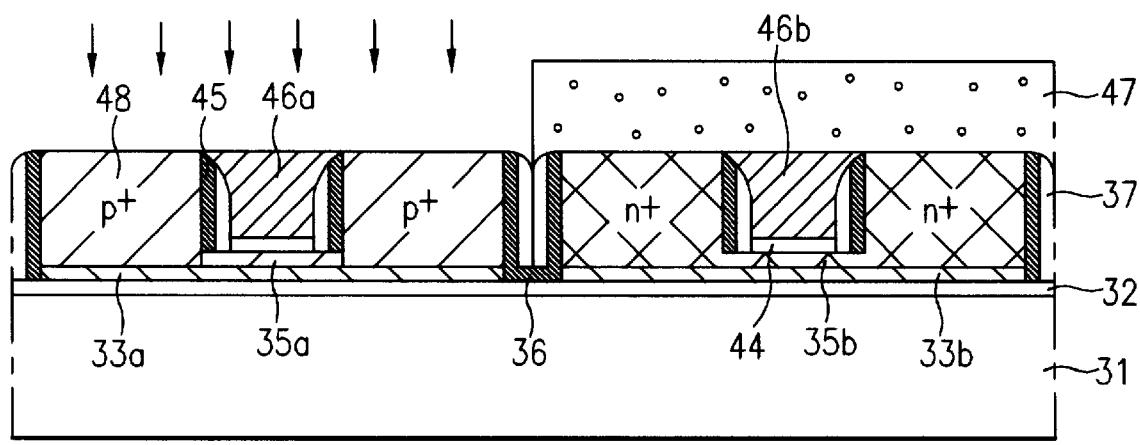
Figure 5N:
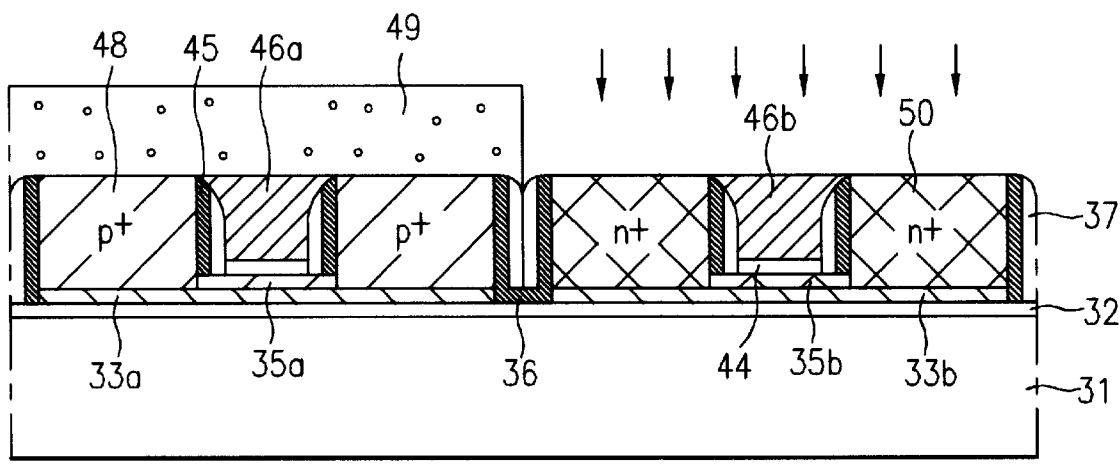
Figure 5O:
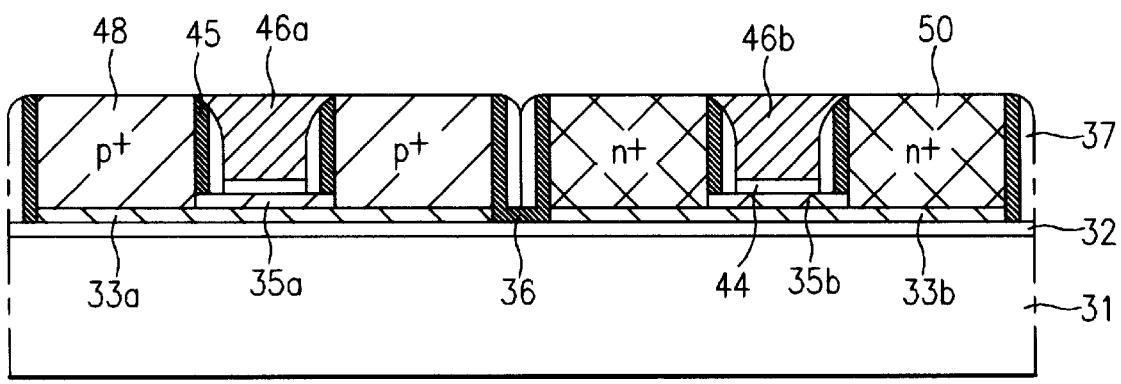

FIGS. 5A to 5O illustrate sections showing the steps of a method for fabricating a CMOS device in accordance with a preferred embodiment of the present invention.

Referring to FIG. 5A, a buried oxide film 32 and a sapphire layer 33 are formed in succession on a semiconductor (e.g., silicon) substrate 31, a first photoresist film 34 is coated on the sapphire layer 33 and subjected to patterning by exposure and development to form a gap in the first photoresist film 34. As shown in FIG. 5B, the sapphire layer 33 is selectively removed using the patterned first photoresist film 34 as a mask, to form second sapphire patterns 33a and 33b.

A PMOS transistor will be formed on the first sapphire pattern 33a, and an NMOS transistor will be formed on the second sapphire pattern 33b. As shown in FIG. 5C, the first photoresist film 34 is removed, and the first and second sapphire patterns 33a and 33b are used as seeds to grow first and second epitaxial semiconductor (e.g., silicon) layers 35a and 35b, respectively.

As shown in FIG. 5D, a first intrinsic semiconductor (e.g., undoped polysilicon) layer 36 and a first insulating layer, e.g., an HLD (High temperature Low pressure Deposition) oxide film, 37 are formed in succession on an entire surface of the semiconductor substrate 31 inclusive of the first and second epitaxial semiconductor layers 35a and 35b. As shown in FIG. 5E, the first HLD oxide film 37 and the first undoped polysilicon layer 38 are etched back, exposing surfaces of the first and second epitaxial semiconductor layers 35a and 35b. The first HLD oxide film 37 and the first undoped polysilicon layer 36, both of which were etched back, remain at both sides of the first and second epitaxial layers 35a and 35b and the first and second sapphire patterns 32a and 33b in the form of sidewalls, for use as device isolating structures for isolating the devices.

As shown in FIG. 5F, a second photoresist film 38 is coated on an entire surface of the semiconductor substrate 31 and subjected to patterning by exposure and development, to leave the second photoresist film 38 only over the second sapphire pattern 33b. Then, p type impurity ions are lightly injected into the first epitaxial layer 35a using the second photoresist film 38 as a mask.

As shown in FIG. 5G, the second photoresist film 38 is removed, and a third photoresist film 39 is coated on an entire surface of the semiconductor substrate 31 and subjected to patterning by exposure and development, to leave the third photoresist film 39 only over the first sapphire pattern 33a. Then, n type impurity ions are lightly injected into the second epitaxial layer 35b using the third photoresist film 39 as a mask.

As shown in FIG. 5H, the third photoresist film 39 is removed, and annealing is conducted for activating the lightly doped n type and p type impurity ions in the first and second epitaxial layers 35a and 35b. Then, a fourth photoresist film 40 is coated on an entire surface of the semiconductor substrate 31 inclusive of the first and second epitaxial layers 35a and 35b and subjected to patterning by exposure and development, to expose a surface of each of the first and second epitaxial layers 35a and 35b. The first and second epitaxial layers 35a and 35b are etched at the exposed surfaces to predetermined depths using the patterned fourth photoresist film 40 as a mask, to form first and second trenches 41a and 41b.

As shown in FIG. 5I, the fourth photoresist film 40 is removed, and a second intrinsic semiconductor (e.g., undoped polysilicon) layer 42 and a second insulating layer (e.g., HLD oxide film) 43 are formed in succession on an entire surface of the semiconductor substrate 31 inclusive of the first and second trenches 41a and 41b. Then, the second HLD oxide film 43 and the second undoped polysilicon layer 42 are subjected to photolithography and etching selectively to expose a predetermined surface or each of the first and second epitaxial layers 35a and 35b. The remaining portions of the layers 42 and 43 define sidewall spacer structures. The regions between the sidewall spacer structures are where the gate electrodes will be formed.

As shown in FIG. 5J, the exposed portions of the first and second epitaxial layers 35a and 35b are oxidized to form a gate insulating film 44 on each of the exposed first and second epitaxial layers 35a and 35b. As shown in FIG. 5K, the second HLD oxide film 43 and the second undoped polysilicon layer 42 are etched back, to form sidewall spacers 45 at both sides of the first and second trenches 41a and 41b. Then, a doped polysilicon layer 46 is formed on an entire surface of the semiconductor substrate 31 inclusive of the gate insulating films and the sidewall spacers 45

As shown in FIG. 5L, the doped polysilicon 46 is etched back, to form first and second gate electrodes 46a and 46b in the first and second trenches 41a and 41b on the gate insulating films 44. The first and second gate electrodes 46a and 46b are formed to a height of the surfaces of the first and second epitaxial layers 35a and 35b.

As shown in FIG. 5M, a fifth photoresist film 47 is coated on an entire surface of the semiconductor substrate 31 inclusive of the first and second electrodes 46a and 46b and subjected to patterning by exposure and development, to leave the fifth photoresist film 47 only over the second sapphire pattern 33b. Then, source/drain D type impurity ions are heavily injected using the fifth photoresist film 47 as a mask, to form heavily doped p type impurity regions 48 in the first epitaxial layer 35a on both sides of the first gate electrode 44a. Thus, a PMOS device with the first gate electrode 46a and the heavily doped p type impurity regions 48 on both sides of the first gate electrode 46a are formed.

As shown in FIG. 5N, the fifth photoresist film 47 is removed, and a sixth photoresist film 49 is coated on an entire surface of the semiconductor substrate 31 inclusive of the first and second gate electrodes 46a and 46b and subjected to patterning by exposure and development, to leave the sixth photoresist film 49 only over the first sapphire pattern 33a. Then, source/drain n type impurity ions are heavily injected using the patterned sixth photoresist film 49 as a mask, to form heavily doped n type impurity regions 50 in the second epitaxial layer 35b or both sides of the second gate electrode 46b. Thus, an NMOS device with the second gate electrode 46b and the heavily doped n type impurity regions 50 on both sides of the second gate electrode 46b are formed.

As shown in FIG. 5O, by removing the Sixth photoresist film 49, a CMOS device with an NMOS device and a PMOS device is completed.

In the CMOS device of the present invention described above, the buried oxide film 32 and the sapphire layer 33 fully isolate the NMOS/PMOS devices. The NMOS/PMOS devices are turned on when a voltage higher than a threshold voltage is applied to the first and second gate electrodes 46a and 46b, respectively.

The formation of the sapphire layer 33 and the buried oxide film 32 of insulating materials under the heavily doped p type impurity regions 48 and the heavily doped n type impurity regions 50, both of which are for use as source/drain, reduces junction capacitances. The formation of the first and second gate electrodes 46a and 46b and the second undoped polysilicon layer 42 and the second HLD oxide film in the first and second trenches 41a and 41b, respectively, reduces parasitic capacitances between the gate and source and drain. This produces an extra high speed CMOS device.

As has been explained, the CMOS device and the method for fabricating the CMOS device of the present invention has the following advantages.

First, the prevention of latch-up and hot carrier injection, by isolating the NMOS and the PMOS transistors with insulating materials, improves device reliability.

Second, the elimination of junction capacitances, and parasitic capacitances by providing an insulating body under the source/drain, improves a device performance.

Third, the formation of the gate electrodes by etching back facilitates planar wiring.

It will be apparent to those skilled in the art that various modifications and variations can be made in the CMOS device and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating a CMOS device, comprising the steps of;

forming an insulating film on a substrate;

forming first and second sapphire patterns on the insulating film at fixed intervals;

forming first and second semiconductor layers on the first, and second sapphire patterns, respectively;

forming an isolating structure at edges of the first and second semiconductor layers;

forming first and second trenches in surfaces of the first and second semiconductor layers to predetermined depths, respectively;

forming sidewall spacer structures at both sides of the first and second trenches, respectively;

forming a gate insulating film on a surface of each of the first and second semiconductor layers in the first and second trenches;

forming first and second gate electrodes on the gate insulating film;

forming a second conductivity type impurity regions in the first semiconductor layer on both sides of the first gate electrode; and, forming a first conductivity type impurity regions in the second semiconductor layer on both sides of the second gate electrode.

2. A method as claimed in claim 1, wherein the insulating film is formed with a buried oxide film.

3. A method as claimed in claim 1, wherein at least one of the isolating structures and the sidewall spacer structures include an intrinsic semiconductor layer and an insulating layer.

4. A method as claimed in claim 1, further comprising injecting first conductivity type impurity ions into the first semiconductor layer.

5. A method as claimed in claim 1, further comprising injecting second conductivity type impurity ions into the second semiconductor layer.

6. A method as claimed in claim 3, wherein the intrinsic semiconductor layer is undoped polysilicon and the insulating layer is an HLD oxide film.

7. A method as claimed in claim 1, wherein the gate insulating films are formed by oxidizing the first and second semiconductor layers.

8. A method as claimed in claim 1, wherein the first and second gate electrodes are formed in the first and second trenches respectively by etching back a doped polysilicon layer.

9. A method as claimed in claim 4, wherein the first conductivity type impurity regions are formed by injecting an additional amount of p type impurities thereto.

10. A method as claimed in claim 5, wherein the second conductivity type impurity regions are formed by injecting an additional amount of n type impurities thereto.

11. A method as claimed in claim 1, wherein the first and second semiconductor layers are grown using the first and second sapphire patterns as seeds.

12. A method of forming a CMOS device, the method comprising:

providing a substrate;

forming a first sapphire pad and a second sapphire pad on said substrate;

growing a first and a second epitaxial silicon layer on said first and second sapphire layers, respectively; and forming a PMOS transistor and an NMOS transistor, in part, from said first and second epitaxial silicon layers, respectively.

* * * * *